United States Patent [19]

Yamamoto et al.

[11] Patent Number: 5,115,515
[45] Date of Patent: May 19, 1992

[54] METHOD AND APPARATUS FOR RADIO COMMUNICATION WITH IMPROVED AUTOMATIC FREQUENCY CONTROL

[75] Inventors: Yuuri Yamamoto, Kanagawa; Mitsuo Makimoto, Yokohama, both of Japan

[73] Assignee: Matsushita Electric Industrial Co., Ltd., Japan

[21] Appl. No.: 367,577

[22] Filed: Jun. 19, 1989

[30] Foreign Application Priority Data

Jun. 29, 1988 [JP] Japan .................... 63-161673

[51] Int. Cl.⁵ .................... H04B 7/00; H04B 1/06; H04B 1/26
[52] U.S. Cl. .................... 455/71; 455/260; 455/265; 455/316
[58] Field of Search ............ 455/54, 70-71, 455/226, 259-260, 264-265, 316, 314-315, 182, 192, 208-209, 258; 331/1 A, 17-18, 25

[56] References Cited

U.S. PATENT DOCUMENTS

| | | | |
|---|---|---|---|
| 4,348,772 | 9/1982 | Leland et al. | 455/260 |
| 4,817,197 | 3/1989 | Shimizu et al. | 455/316 |
| 4,921,467 | 5/1990 | Lax | 455/264 |
| 4,932,072 | 6/1990 | Toko | 455/316 |

FOREIGN PATENT DOCUMENTS 253680 1/1988 European Pat. Off.

Primary Examiner—Reinhard J. Eisenzopf
Assistant Examiner—Andrew Faile
Attorney, Agent, or Firm—Lowe, Price, LeBlanc & Becker

[57] ABSTRACT

A base station transmits a radio-frequency signal to a mobile station. The radio-frequency signal includes a frequency calibration signal. The mobile station includes a receiver receiving the radio-frequency signal. The receiver includes a reference oscillator generating a reference signal whose frequency is controlled in accordance with the frequency calibration signal. The receiver includes mixers and local oscillators. The mixers mix the radio-frequency signal with local oscillator signals from the local oscillator signals and convert the radio-frequency signal into a corresponding intermediate-frequency signal. The local oscillator signals are synchronized with the reference signal. The frequency of the intermediate-frequency signal is divided to derive a frequency-divided signal. The frequency of the reference signal is controlled in accordance with the frequency-divided signal.

10 Claims, 2 Drawing Sheets

METHOD AND APPARATUS FOR RADIO COMMUNICATION WITH IMPROVED AUTOMATIC FREQUENCY CONTROL

BACKGROUND OF THE INVENTION

This invention relates to a method and an apparatus for radio communication such as FDMA (frequency division multiple access) radio communication or TDMA (time division multiple access) radio communication.

In known radio communication networks between base stations and mobile stations, the base stations transmit RF signals whose carriers have respective fixed frequencies. Double-superheterodyne receivers are sometimes used in such mobile stations. In some double-superheterodyne receivers of the mobile stations, during the communcation with a base station, a frequency variation in the first local oscillator is detected by measuring both of the frequencies of the second local oscillator and the output from the second IF amplifier, and the frequency of the first local oscillator is controlled in response to the detected frequency variation so that the tuning to the RF signal from the base station can be held. These prior-art double-superheterodyne receivers have problems as follows. The frequency measurement for the detection of the frequency variation in the first local oscillator tends to make it difficult to control the frequency of the first local oscillator at a high speed. A frequency variation in the second local oscillator causes a decrease in the frequency stability of the receiver.

SUMMARY OF THE INVENTION

It is an object of this invention to provide an excellent method and an excellent apparatus for radio communication.

According to this invention, a base station transmits a radio-frequency signal to a mobile station. The radio-frequency signal includes a frequency calibration signal. The mobile station including a receiver receiving the radio-frequency signal. The receiver includes a reference oscillator generating a reference signal whose frequency is controlled in accordance with the frequency calibration signal. The receiver includes mixers and local oscillators. The mixers mix the radio-frequency signal with local oscillator signals from the local oscillator signals and convert the radio-frequency signal into a corresponding intermediate-frequency signal. The local oscillator signals are synchronized with the reference signal. The frequency of the intermediate-frequency signal is divided to derive a frequency-divided signal. The frequency of the reference signal is controlled in accordance with the frequency-divided signal.

DESCRIPTION OF THE PREFERRED EMBODIMENT

A base station (not shown) transmits an RF signal whose carrier has a predetermined highly-stabilized frequency fso. The RF signal contains frequency calibration components representing the carrier frequency fso. For example, the frequency calibration components periodically occur at a predetermined timing in a burst manner.

Figure 1:
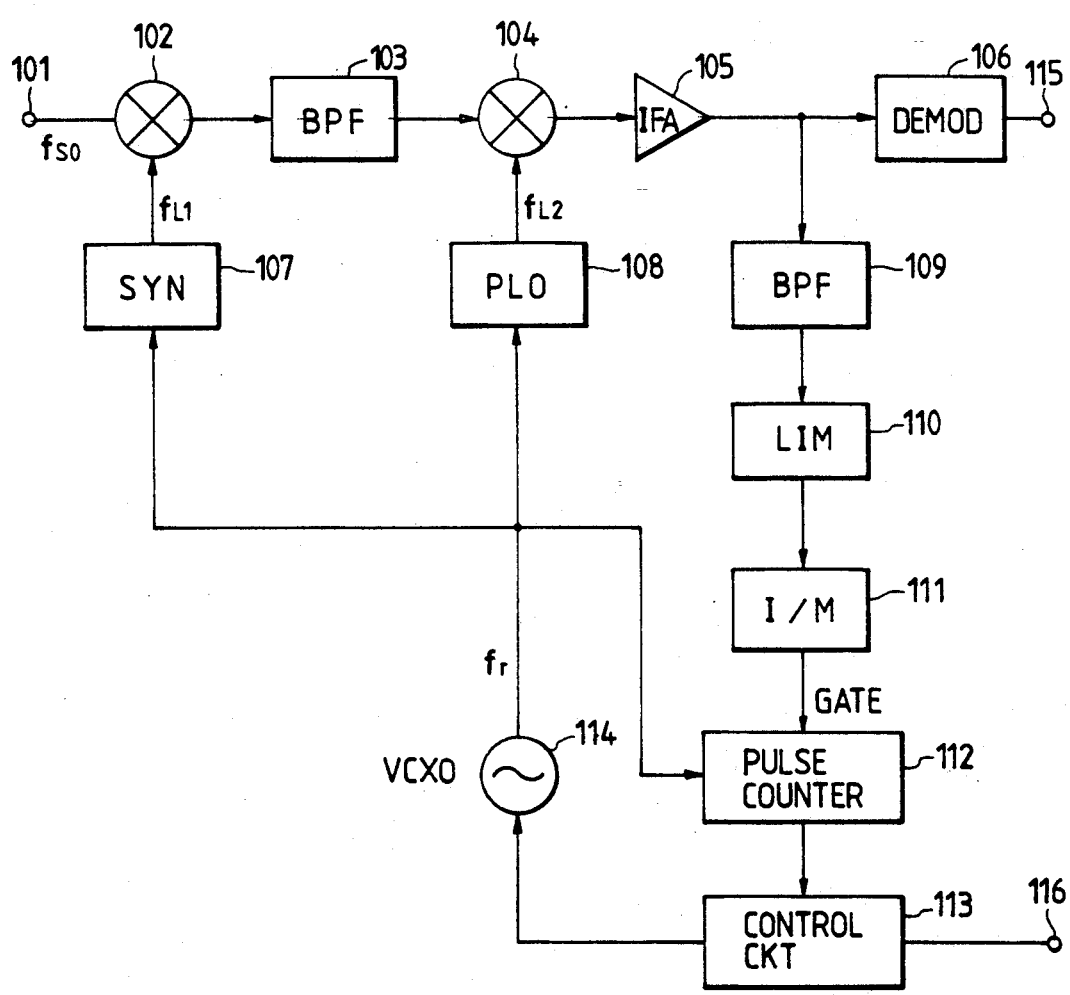
FIG. 1 is a block diagram of a radio communication apparatus according to an embodiment of this invention.

With reference to FIG. 1, a radio communication apparatus for a mobile station includes a receiver input terminal 101. A received RF signal transmitted from a base station is fed to a first mixer 102 via the receiver input terminal 101. The carrier of the RF signal has a highly-stabilized frequency fso. The first mixer 102 receives an output signal from a first local oscillator 107 composed of a frequency synthesizer. The frequency of the first local oscillator signal is represented by the character "fL1". The first mixer 102 heterodynes the RF signal with the first local oscillator signal and converts the RF signal into a corresponding first IF signal. Specifically, the first mixer 102 functions to derive the frequency difference between the RF signal and the first local oscillator signal.

The first IF signal is passed to a second mixer 104 through a band pass filter 103. The second mixer 102 receives an output signal from a second local oscillator 107 composed of a phase locked oscillator. The frequency of the second local oscillator signal is represented by the character "fL2". The second mixer 102 heterodynes the first IF signal with the second local oscillator signal and converts the first IF signal into a corresponding second IF signal. Specifically, the second mixer 104 functions to derive the frequency difference between the first IF signal and the second local oscillator signal. The second IF signal is fed to a demodulator or a detector 106 via an IF amplifier 105. The frequency of the second IF signal outputted from the IF amplifier 105 is represented by the character "fIF". The demodulator 106 derives an audio signal from the second IF signal. The audio signal is applied to an audio output terminal 115.

The second IF signal from the IF amplifier 105 is also fed to a frequency divider 111 via a band pass filter 109 and a limiter 110. The frequency divider 111 divides the frequency of the second IF signal by a value "1/M" where the character M denotes a predetermined integer. The output signal from the frequency divider 111 is used as a gate signal applied to a pulse counter 112. The output signal from the pulse counter 112 is fed to a control circuit 113.

A reference oscillator 114 composed of a voltage-controlled crystal oscillator outputs a reference signal to the frequency synthesizer 107, the phase locked oscillator 108, and the pulse counter 112. The frequency of the reference signal is represented by the character "fr". The reference signal frequency fr is controlled by the voltage output signal from the control circuit 113. The control circuit 113 receives a timing signal from a control section of the radio communication apparatus via an input terminal 116. The timing signal enables the control circuit 113 to perform a frequency-error determination during an interval where the frequency calibration components are present in the RF signal. The frequency-error determination will be described hereinafter. The frequency synthesizer 107 generates the first local oscillator signal on the basis of the reference signal through a phase synchronizing process. The phase locked oscillator 108 generates the second local oscillator signal on the basis of the reference signal through a phase locking process. Pulses of the reference signal is counted by the pulse counter 112 during an interval determined by the gate signal fed from the frequency divider 111.

The reference signal frequency fr equals a given optimal frequency fro when the receiver of the radio communication apparatus is exactly tuned to or synchronized with the RF signal transmitted from the base station. The frequencies fr, fro, fL1, and fL2 have the following relations.

$$fr = fro(1+e) \quad (1)$$

$$fL1 = K1ro(1+e) \quad (2)$$

$$fL2 = K2ro(1+e) \quad (3)$$

where the character "e" denotes a frequency error or a frequency deviation (variation quantity), and the characters "k1" and "k2" denote predetermined constants.

The frequency fIF of the second IF signal from the IF amplifier 105 equals a given optimal frequency fIFo when the receiver of the radio communication apparatus is exactly tuned to or synchronized with the RF signal transmitted from the base station. The frequencies fIF, fIFo, fso, fL1, and fL2 have the following relations.

$$fIF = fso - fL1 - fL2 \quad (4)$$

$$= fIFo - efro(k1 + k2) \quad (5)$$

$$= fIFo\{1 - e(k1 + k2)fro/fIFo\} \quad (6)$$

The band pass filter 109 removes unnecessary components from the second IF signal. The limiter 110 holds the amplitude of the output signal from the band pass filter 109 at a constant level. The frequency divider 111 generates the gate signal on the basis of the output signal from the limiter 110. The gate signal determines the gate interval T of the pulse counter 112 which is expressed by the following equation (7).

$$T = M/fIF \quad (7)$$
$$= M/fIFo\{1 - e(k1 + k2)fro/fIFo\}$$

Since the pulse counter 112 continues to count the pulses of the reference signal during the gate interval T, the total number N of the pulses counted by the pulse counter 112 during the gate interval T is expressed by the following equation (8).

$$N = Tfr \quad (8)$$
$$= Mfro(1 + e)/fIFo\{1 - e(k1 + k2)fro/fIFo\}$$

The control circuit 113 is informed of the counted pulse number N by the pulse counter 112. The control circuit 113 includes a microcomputer or a calculator which calculates the frequency error "e" on the basis of the counted pulse number N by referring to the equation (8). It should be noted that the values M, fro, fIFo, k1, and k2 in the equation (8) are known constants. Then, the control circuit 113 determines a target voltage of the control signal to the reference oscillator 114 which enables the frequency error "e" to be nullified.

Finally, the control circuit 113 outputs the control signal whose voltage equals the determined target voltage. Accordingly, the frequency error "e" is held substantially null. In other words, the receiver of the radio communication apparatus remains substantially exactly tuned to or synchronized with the RF signal transmitted from the base station.

The accuracy of the measurement of the frequency error "e" depends on the frequency dividing factor M. In the case where the frequencies fL1, fL2, fIFo, and fro are equal to 900 MHz, 90 MHz, 455 kHz, and 100000 MHz respectively and thus the values k1 and k2 are equal to 100 and 10 respectively, when the frequency dividing factor M equals 2048 ($2^{11}$), the frequency error "e" can be detected with an accuracy of about 0.1 ppm.

Figure 2:
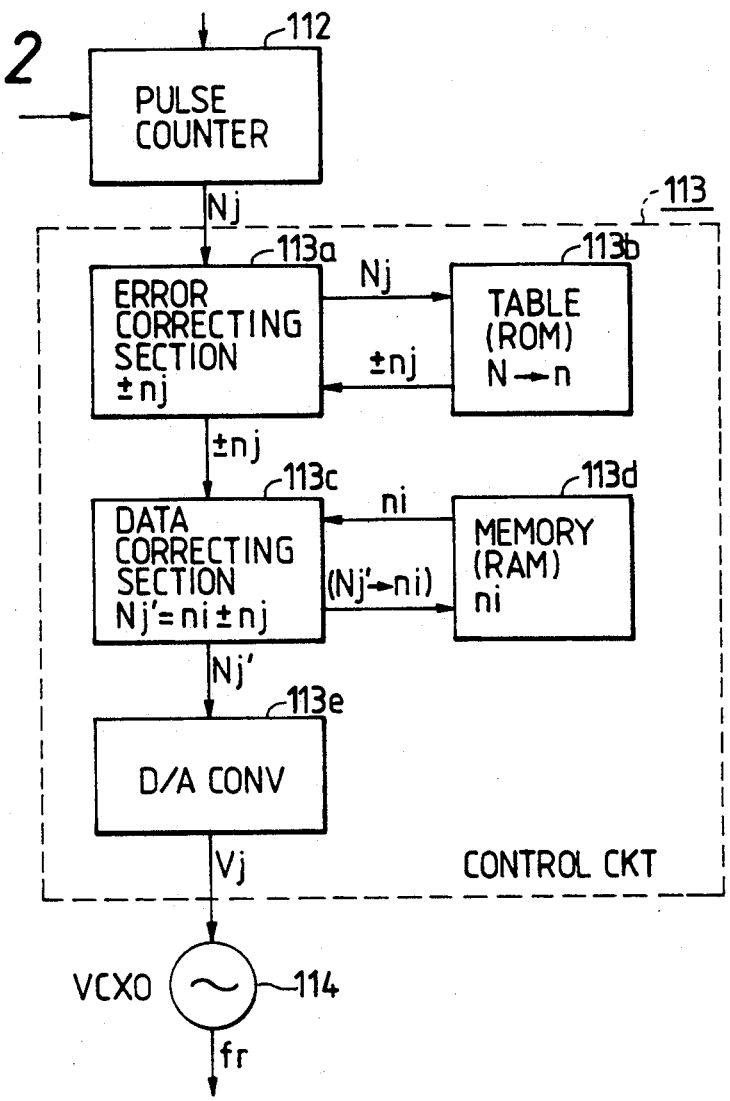
FIG. 2 is a block diagram of the control circuit of FIG. 1.
Figure 3:
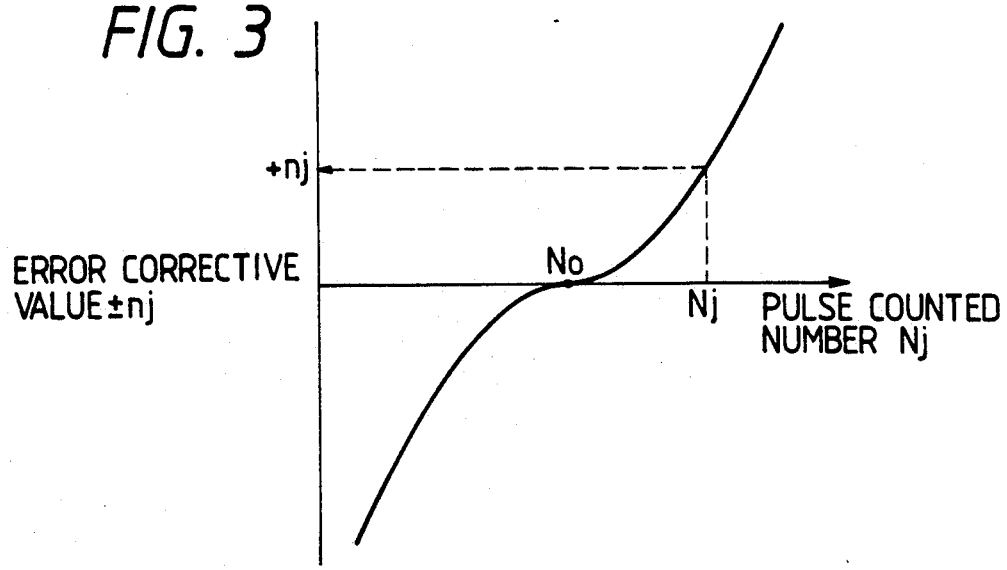
FIG. 3 is a diagram showing the relation between the counted pulse number and the corrective value which is held in the error reference table of FIG. 2.

As shown in FIG. 2, the control circuit 113 includes an error correcting section 113a which determines a corrective value ±nj in accordance with the counted pulse number Nj being outputted from the pulse counter 112. The error correcting section 113a uses an error reference table 113b in the determination of the corrective value ±nj. The error reference table 113b holds a predetermined relation between the counted pulse number Nj and the corrective value ±nj. This relation is previously chosen in view of a detection error in the pulse counter 112 and a nonlinearity in the voltage-frequency characteristics of the reference oscillator 114. FIG. 3 shows one example of the relation between the counted pulse number Nj and the corrective value ±nj. The error reference table 113b is formed by a read only memory. The control circuit 113 includes a data correcting section 113c which receives the corrective value ±nj from the error correcting section 113a. The data correcting section 113c adds the corrective value ±nj to the previously-obtained data ni to generate a new data Nj'. The previously-obtained data ni is fed from a data memory 113d composed of a random access memory. The new data Nj' is outputted to a digital-to-analog (D/A) converter 113e and the data memory 113d. In the data memory 113d, the new data Nj' is set in the variable ni so that the data ni is updated. The D/A converter 113e generates a voltage Vj which depends on the data Nj'. The generated voltage Vj constitutes the voltage control signal applied to the reference generator 114.

It should be noted that this embodiment may be modified. For example, the first local oscillator 107 or the second local oscillator 108 may be composed of a frequency multiplier or a frequency divider.

This invention can be applied to a single-superheterodyne receiver. This invention can also be applied to a triple-superheterodyne receiver or other superheterodyne receivers in which all of local oscillator signals are generated on the basis of a common reference signal.

What is claimed is:

1. In a communications system for providing communications between a base station and a mobile station, the base station transmitting a radio-frequency signal to the mobile station, the radio-frequency signal including a frequency calibration signal, the mobile station including a receiver for receiving the radio-frequency signal, the receiver including a reference oscillator generating a reference signal having a frequency responsive to a frequency of the frequency calibration signal, the receiver further including a local oscillator and a radio-frequency mixer for mixing the radio-frequency signal with a signal from the local oscillator thereby converting the radio-frequency signal into an intermediate-frequency signal, a method comprising the steps of:

synchronizing the local oscillator signal with the reference signal;

dividing a frequency of the intermediate-frequency signal and thereby deriving a frequency-divided signal; and controlling a frequency of the reference signal in response to the frequency-divided signal.

2. The method of claim 1 wherein the controlling step comprises supplying a control signal a voltage of which is responsive a frequency of the frequency divided signal, and varying the frequency of the reference signal in response to the control signal.

3. In a communications system for providing communications between a base station and a mobile station, the base station transmitting a radio-frequency signal to the mobile station, the radio-frequency signal including a frequency calibration signal, the mobile station including a receiver for receiving the radio-frequency signal, the receiver including a reference oscillator supplying a reference signal having a frequency responsive to a frequency of said frequency calibration signal, the receiver including a local oscillator and a radio-frequency mixer for mixing the radio-frequency signal with a local oscillator signal supplied by the local oscillator and, in response, converting the radio-frequency signal into an intermediate-frequency signal, a method comprising the steps of:

synchronizing a frequency of the local oscillator signal with a frequency of the reference signal;

dividing a frequency of the intermediate-frequency signal and thereby deriving a frequency-divided gate signal;

counting pulses of the reference signal during an interval determined by the gate signal;

detecting a frequency error of the reference signal from an optimal frequency in response to a number of the counted pulses, the optimal frequency responsive to a frequency of the frequency calibration signal; and controlling the frequency of the reference signal in response to the detected frequency error.

4. The method of claim 3 wherein the controlling step comprises supplying a voltage signal having a voltage responsive to the detected frequency error, and varying the frequency of the reference signal in in response to said voltage of the voltage signal.

5. In a communications system for supplying communication between a base station and a mobile station, the base station transmitting a radio-frequency signal to the mobile station, the radio-frequency signal including a frequency calibration signal, the mobile station including a receiver for receiving the radio-frequency signal, the receiver including a local oscillator and a mixer for mixing the radio-frequency signal with a local oscillator signal supplied by the local oscillator thereby converting the radio-frequency signal into an intermediate-frequency signal, a method comprising the steps of:

generating a reference signal;

controlling a frequency of the local oscillator signal in response to a frequency of the reference signal;

dividing a frequency of said intermediate frequency-signal thereby deriving a gate signal;

detecting a frequency error of the reference signal responsive to a frequency of the frequency calibration signal and said gate signal; and controlling the frequency of the reference signal in accordance with the detected frequency error.

6. In a communications system for providing communications between a base station and a mobile station, the base station transmitting a radio-frequency signal to the mobile station, the radio-frequency signal including a frequency calibration signal, the mobile station including a receiver for receiving the radio-frequency signal, the receiver including a reference oscillator supplying a reference signal having a frequency controlled in response to a frequency of the frequency calibration signal, the receiver including a local oscillator and a mixer for mixing the radio-frequency signal with a local oscillator signal supplied by the local oscillator and converting the radio-frequency signal into an intermediate-frequency signal, an apparatus comprising:

means for synchronizing the a frequency of the local oscillator signal with the frequency of the reference signal;

means for dividing a frequency of the intermediate-frequency signal and thereby deriving a frequency-divided signal; and means for controlling the frequency of the reference signal in in response to a frequency of the frequency-divided signal.

7. The apparatus of claim 6 wherein the controlling means comprises means for generating a voltage signal in response to a frequency of the frequency-divided signal, and means for controlling the frequency of the reference signal in in response to a voltage of the voltage signal.

8. In a communications system for providing communications between a base station and a mobile station, the base station transmitting a radio-frequency signal to the mobile station, the radio-frequency signal including a frequency calibration signal, the mobile station including a receiver for receiving the radio-frequency signal, the receiver including a reference oscillator generating a reference signal a frequency of which is responsive to a frequency of the frequency calibration signal, the receiver including a local oscillator and a radio-frequency mixer for mixing the radio-frequency signal with a local oscillator signal supplied by the local oscillator and converting the radio-frequency signal into a intermediate-frequency signal, an apparatus comprising:

means for synchronizing the local oscillator signal with the reference signal;

means for dividing a frequency of the intermediate-frequency signal and thereby derive a frequency-divided gate signal;

means for counting pulses of the reference signal during an interval a responsive to the gate signal;

means for detecting a frequency error of the reference signal from a nominal frequency in response to a number of the counted pulses, the nominal frequency responsive to a frequency of the frequency calibration signal; and means for controlling the frequency of the reference signal in response to the detected frequency error.

9. The apparatus of claim 8 wherein the controlling means comprises means for generating a voltage signal in response to the detected frequency error, and means for controlling the frequency of the reference signal in response to a voltage of the voltage signal.

10. In a communications system for providing communications between a base station and a mobile station, the base station transmitting a radio-frequency signal to the mobile station, the radio-frequency signal including a frequency calibration signal, the mobile statio including a receiver for receiving the radio-frequency signal, the receiver including a local oscillator and a radio-frequency mixer for mixing the radio-frequency signal with a local oscillator signal supplied by the local oscillator and converting the radio-frequency signal into an intermediate-frequency signal, as apparatus comprising:

means for generating a reference signal;

means for controlling a frequency of the local oscillator signal in response to a frequency of the reference signal;

means for dividing a frequency of said intermediate-frequency signal thereby deriving a gate signal;

means responsive to said reference signal and said gate signal for detecting a frequency error of the reference signal responsive to the frequency of the calibration signal; and means for controlling the frequency of the reference signal in response to the detected frequency error.

* * * * *